United States Patent [19]
Takahashi

[11] Patent Number: 6,109,756
[45] Date of Patent: Aug. 29, 2000

[54] CATOPTRIC REDUCTION PROJECTION OPTICAL SYSTEM

[75] Inventor: Tomowaki Takahashi, Yokohama, Japan

[73] Assignee: Nikon Corporation, Tokyo, Japan

[21] Appl. No.: 09/400,173

[22] Filed: Sep. 21, 1999

[30] Foreign Application Priority Data

Sep. 21, 1998 [JP] Japan .................................. 10-266124
Sep. 22, 1998 [JP] Japan .................................. 10-267704

[51] Int. Cl.$^7$ ...................................................... G02B 5/08
[52] U.S. Cl. .......................... 359/857; 359/858; 359/861; 359/365; 359/366; 359/727; 359/728; 359/730
[58] Field of Search ..................................... 359/857, 858, 359/861, 862, 863, 364, 365, 366, 726, 727, 728, 729, 730, 731; 378/34

[56] References Cited

U.S. PATENT DOCUMENTS

| | | | |
|---|---|---|---|
| 5,220,590 | 6/1993 | Bruning et al. ............................ | 378/34 |
| 5,309,276 | 5/1994 | Rodgers .................................... | 359/366 |
| 5,315,629 | 5/1994 | Jewell et al. .............................. | 378/34 |
| 5,805,365 | 9/1998 | Sweatt ...................................... | 359/858 |
| 5,815,310 | 9/1998 | Williamson ............................... | 359/365 |

*Primary Examiner*—Cassandra Spyrou
*Assistant Examiner*—Mohammad Y. Sikder
*Attorney, Agent, or Firm*—Oliff & Berridge, PLC

[57] ABSTRACT

A catoptric reduction projection optical system (8), exposure apparatus (EX) including same, and a method using same for forming in a second plane (WP) a reduced image of an object (R) in a first plane (RP). The projection optical system includes, in order along a folded optical path on in optical axis (AX), from the first plane to the second plane, a first mirror (M1) having a concavely shaped reflecting surface and a first vertex, a second mirror (M2) having a second vertex, a third mirror (M3) having a convexly shaped reflecting surface and a third vertex, a single aperture stop (AS), and a fourth mirror (M4) having a concavely shaped reflecting surface and a fourth vertex. The projection optical system also preferable satisfies a number of design conditions.

17 Claims, 8 Drawing Sheets

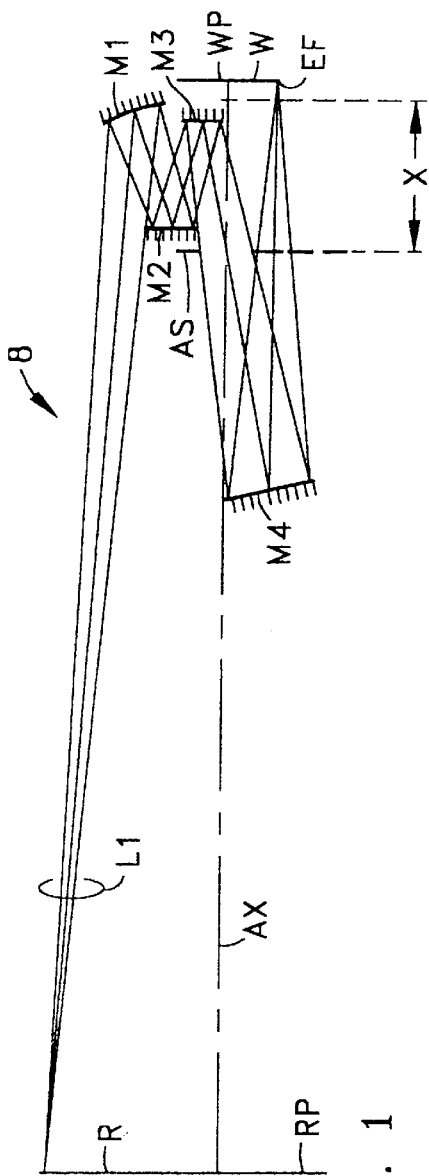
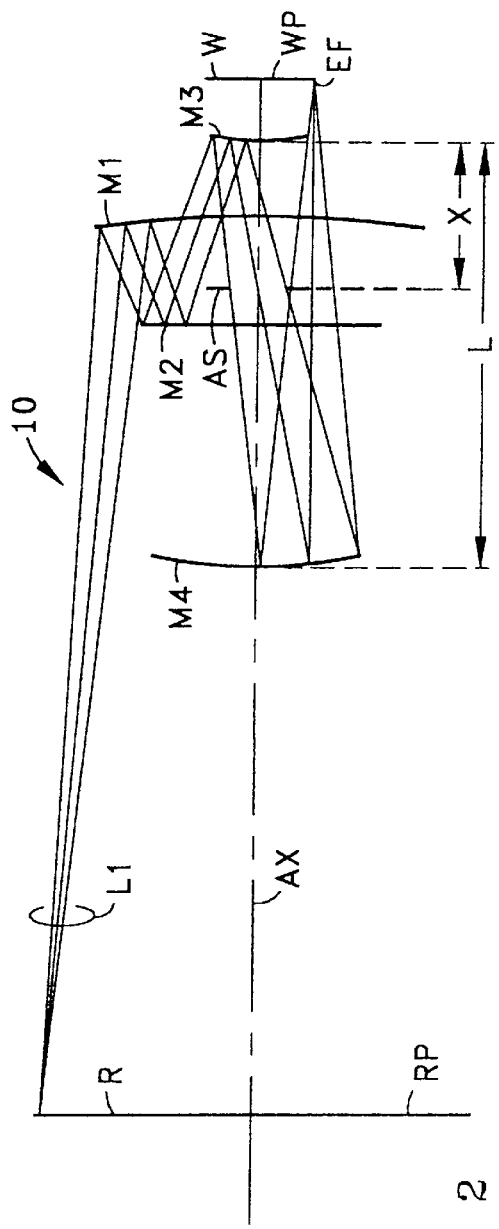
FIG. 1
FIG. 2

CATOPTRIC REDUCTION PROJECTION OPTICAL SYSTEM

FIELD OF THE INVENTION

The present invention pertains to a catoptric reduction projection optical system for use in a stepper or other such exposure apparatus for fabricating semiconductor devices, liquid crystal display devices, thin-film magnetic heads, or the like, and to an exposure apparatus and exposure method employing such a catoptric reduction projection optical system.

BACKGROUND OF THE INVENTION

In recent years, there has been an ever increasing degree of fineness of detail in fabrication of semiconductors and fabrication of substrates on which semiconductor chips are mounted, and higher and higher resolutions have been demanded of the projection and other such exposure apparatuses that expose the patterns thereon.

To satisfy this demand, it is necessary to shorten the light source wavelength and increase the NA (the numerical aperture) of the projection optical system. However, as the wavelength is shortened, the number of optical glasses capable of standing up to practical use becomes limited due to absorption of light. At wavelengths of 180 nm and shorter, the only glass permitting practical use is fluorite. Moreover, in the deep ultraviolet and x-ray domains, there may be no optical glass at all that is capable of being used. In such situations, it becomes impossible to construct a reduction projection optical system either from an entirely dioptric optical system or a catadioptric optical system.

For this reason, a number of so-called catoptric reduction optical systems, wherein projection optical systems are constructed entirely from catoptric systems, have been proposed, such as those disclosed in Japanese Laid-Open Patent Application (Kokai) No. S52[1977]-5544, Japanese Patent No. 2603225, U.S. Pat. No. 5,063,586, U.S. Pat. No. 5,153,898, U.S. Pat. No. 5,220,590, U.S. Pat. No. 5,353,322, U.S. Pat. No. 5,410,434, and Japanese Laid-Open Patent Application (Kokai) No. H9[1997]-211332.

Of the aforementioned proposed art, that disclosed in the first, Japanese Laid-Open Patent Application (Kokai) No. S52[1977]-5544, is basically a variation on the Offner catadioptric optical system, a well-known aplanatic optical system of magnification unity consisting of concentric mirrors. This optical system consists of two elements, a first spherical mirror and a second spherical mirror, the respective radii of curvature of which are in the ratio 2:1 and the respective centers of curvature of which are coincident. In addition, light rays leaving an object point in a plane perpendicular to an optical axis passing through the centers of curvature are incident on the first spherical mirror which has a concave surface so as to be parallel to the optical axis, are reflected, are incident on the second spherical mirror which has a convex surface, are again reflected, are incident on a third spherical mirror, and are reflected therefrom to form an image in aplanatic fashion at an opposing point symmetrically located with respect to the optical axis.

While the case described in the aforementioned art is in terms of an image magnification of unity, if the object point is moved from the aforementioned plane perpendicular to the optical axis in a direction away from the mirrors, the imaged point will move from the plane perpendicular to the optical axis in a direction toward the mirrors, creating a reduction projection system. However, because a unity magnification system is being made into a reduction system, the location of the stop must be shifted. In addition, the first spherical mirror which has a concave surface and which was twice used as a reflective surface must be made into separate mirrors as appropriate to accommodate that reflection, and magnification must be adjusted. Naturally, the optical system will no longer be aplanatic, so to compensate for this, reflective surfaces should be made aspheric and use should of course be restricted to a ringfield zone.

While the basic structure is as described above, in the system as described the object and the image will be on the same side. If a configuration wherein object and image are on opposite sides is desired, because there will have to be a even number of mirrors the optical path is sometimes flipped by inserting a single plane mirror at the interior thereof or a convex surface is added at the enlargement side and the number of degrees of freedom thereby increased. The last of the prior art examples, Japanese Laid-Open Patent Application (Kokai) No. H9[1997]-211332, discloses what are basically two of the aforementioned reduction projection optical systems, each with a concave-convex-concave mirror configuration, lain in series, with an intermediate image being formed therebetween.

Because the projection optical system at Japanese Laid-Open Patent Application (Kokai) No. H9[1997]-211332 contains a total of six reflective surfaces, there is a large number of degrees of freedom for correction of aberration. However, there is the problem that the excessive number of reflective surfaces results in large optical losses. Moreover, imaging performance of the overall projection optical system is lowered as a result of the aberrations produced by the manufacturing errors of the reflective surfaces therein. Accordingly, there is the problem that an excessive number of reflective surfaces necessitates that tolerances for each of the reflective surfaces therein be held to extremely tight values, making manufacture difficult. Accordingly, while imaging performance is theoretically high from an optical design standpoint, the imaging performance of the device that is actually manufactured may be inadequate.

As described above, a catoptric optical system having a concave-convex-concave three-element construction forms the basis for these optical systems, and these constructions excel to a corresponding extent. However, when it becomes desirable to further increase optical system performance, the central convex mirror proves disadvantageous. This convex mirror imparts divergence to the light rays from the concave mirrors at either side thereof, and to accommodate those concave mirrors at either side thereof there is a tendency for its power to be made too strong (excessive refractive power magnitude), resulting in a configuration that is liable to produce aberration.

SUMMARY OF THE INVENTION

The present invention pertains to a catoptric reduction projection optical system for use in a stepper or other such exposure apparatus for fabricating semiconductor devices, liquid crystal display devices, thin-film magnetic heads, or the like, and to an exposure apparatus and exposure method employing such a catoptric reduction projection optical system.

A goal of the present invention is therefore to achieve extremely superior imaging performance while substantially maintaining telecentricity at the object side and in addition keeping the number of reflective surfaces to a comparatively small number, and to moreover improve imaging performance in the device that is actually manufactured.

Another goal of the present invention is to avoid the disadvantage whereby the power of a central convex mirror tends to be made too strong in attempting to accommodate concave mirrors at either side thereof.

Accordingly, a first version of the invention is a catoptric reduction projection optical system for forming in a second plane a reduced image of an object in a first plane. The system comprises, in order along a folded optical path on an optical axis, from the first plane to the second plane: a first mirror having a concavely shaped reflecting surface and a first vertex; a second mirror having a second vertex; a third mirror having a convexly shaped reflecting surface and a third vertex; a single aperture stop; and a fourth mirror having a concavely shaped reflecting surface and a fourth vertex. If x is a distance along the optical axis from the third vertex to the aperture stop, and L is a distance along the optical axis from the third vertex to the fourth vertex, then the following condition is preferably satisfied:

$$0.1 \leq x/L \leq 0.9.$$

A second version of the invention is a catoptric reduction projection optical system as described above, wherein the paraxial Petzval value of the first mirror is P1, the paraxial Petzval value of the third mirror is P3, the paraxial Petzval value of the fourth mirror is P4, and the following condition is satisfied:

$$-0.005 < (P1+P3+P4) < 0.005.$$

A third version of the invention is a catoptric reduction projection optical system as described above, wherein the second mirror has a convexly shaped reflecting surface and a paraxial Petzval value of P2, and the following conditions are preferably satisfied:

$$-0.005 < (P1+P4) < 0.000,$$

$$0.000 < (P2+P3) < 0.005, \text{ and}$$

$$-0.005 < (P1+P4)+(P2+P3) < 0.005.$$

A fourth version of the invention is a projection exposure apparatus comprising a reticle stage capable of holding a reticle in a first plane, a photosensitive substrate stage capable of holding a photosensitive substrate in a second plane, an illumination optical system for guiding actinic light of a prescribed wavelength to the reticle in the first plane, and a catoptric reduction projection optical system as described above arranged between the reticle and the photosensitive substrate.

A fifth version of the invention is a method of exposing a photosensitive substrate with a pattern present on a reticle. The method comprises the steps of first illuminating a portion of the pattern present on the reticle, then projecting light from the reticle through a catoptric reduction projection optical system as described above, and then scanning the reticle and the photosensitive substrate relative to the projection optical system and forming an image of substantially the entire pattern on the photosensitive substrate.

BRIEF DESCRIPTION OF THE DRAWINGS

FIG. 1 is a cross-sectional schematic optical diagram of a projection optical system in a first embodiment according to a first aspect of the present invention;

FIG. 2 is a cross-sectional schematic optical diagram of a catoptric reduction projection optical system in a fourth embodiment according to a second aspect of the present invention;

DETAILED DESCRIPTION OF THE INVENTION

Figure 3:
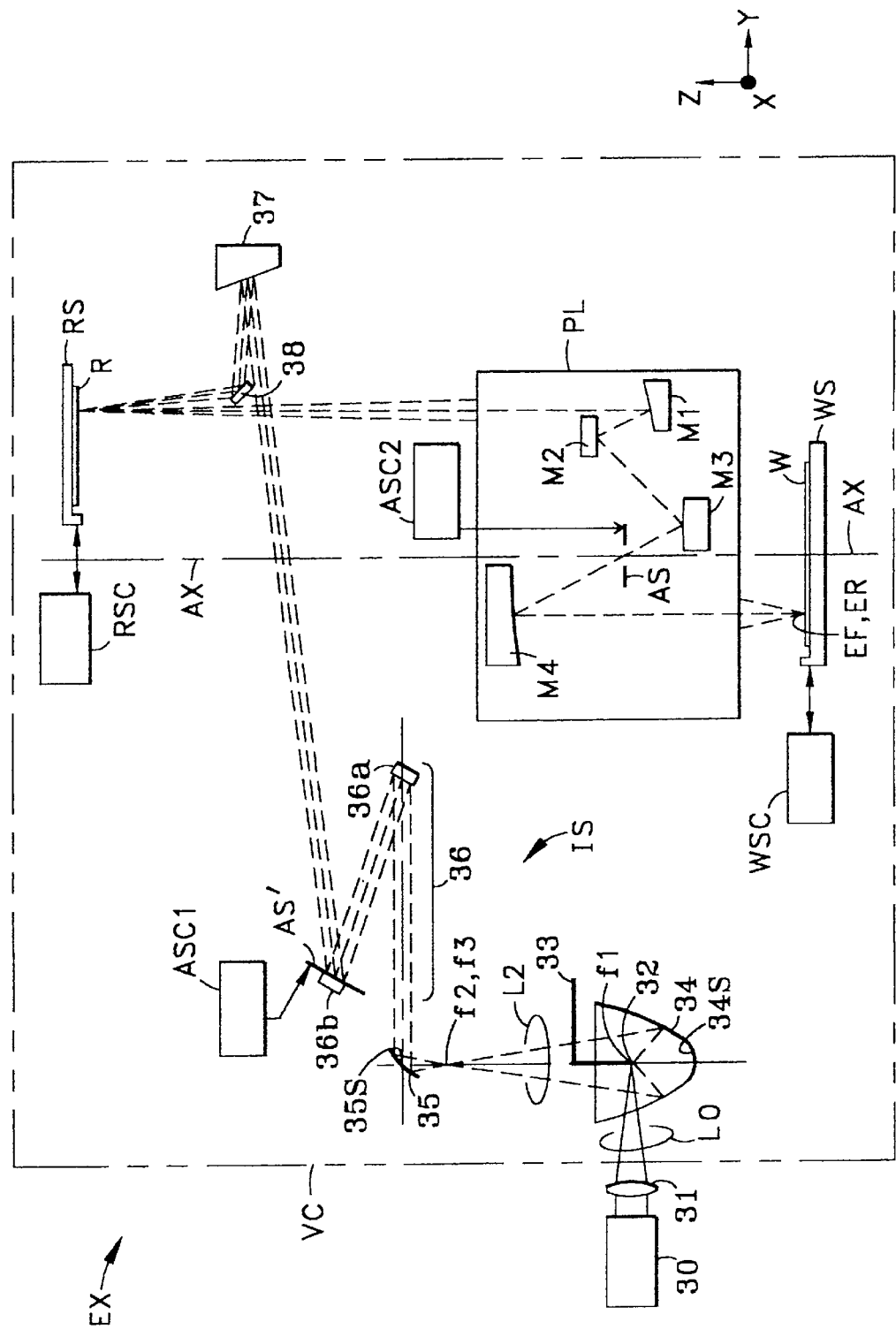
FIG. 3 is a schematic diagram of an exposure apparatus equipped with a catoptric reduction projection optical system according to the present invention.

The present invention pertains to a catoptric reduction projection optical system for use in a stepper or other such exposure apparatus for fabricating semiconductor devices, liquid crystal display devices, thin-film magnetic heads, or the like, and to an exposure apparatus and exposure method employing such a catoptric reduction projection optical system.

First Aspect of Invention

The present invention avoids the aforementioned disadvantage of prior art optical systems whereby the power of a central convex mirror tends to be made too strong in attempting to accommodate concave mirrors at either side thereof. Accordingly, with reference to FIG. 1, the projection optical system 8 in a configuration according to a first aspect of the present invention employs as basic structure a four-mirror construction along an optical axis AX wherein there are, in order along an optical path from a first plane RP to a second plane WP, a concave mirror M1, a convex mirror M2, a convex mirror M3, and a concave mirror M4.

Adoption of such a constitution makes it possible to distribute the power (refractive power) of a single central convex mirror over two convex mirrors M2 and M3, and to control the aberration produced therefrom to the greatest extent possible. Two convex mirrors M2 and M3 are employed instead of a single convex mirror, alleviating the sagittal coma and meridional coma liable to be produced by a single convex mirror.

However, adoption of such a construction would normally cause light rays to be reflected far off-axis by the two convex mirrors. However, through careful selection of power as well as the distribution thereof, this is alleviated in the present aspect of the invention. At the same time, receipt of those light rays by concave mirrors results M1 and M4 in control of off-axis aberration to the greatest extent possible, and also corrects for distortion.

Adoption of such a construction has made it possible to obtain a high-performance catoptric reduction projection optical system 8. Naturally, such an optical system completely departs from the structure of the Offner-type aplanatic lens. That is, the Offner-type aplanatic lens is characterized by coincidence of the centers of curvature of the several spherical mirrors therein, unity magnification and a structure wherein aberrations produced by the several reflective surfaces therein are canceled by completely symmetric surfaces. Furthermore, the reduction-magnification optical systems of the aforementioned prior art derived from the Offner-type configuration are constructed such that the centers of curvature of the several mirrors therein are basically present at the same side with respect to those several mirrors. Aberrations produced at the several mirrors are, again, canceled in respectively appropriate ratios corresponding to the fact that image magnification is reducing and not unity.

Now, projection optical system 8 of the present aspect of the invention employs two opposing convex mirrors M2 and M3. The centers of curvature of mirrors M2 and M3 are present on exactly opposite sides with respect to the mirrors. In contrast hereto, in the Offner-type aplanatic lens and the corresponding prior art cited above, the centers of curvature are either coincident or are at least present on the same side. Accordingly, the construction of the projection optical system of the present invention differs significantly from the prior art.

For this reason, the very mechanism by which aberration is produced in the optical system of the present invention is completely unlike that in any optical system heretofore. Accordingly, it follows that new methods are needed to correct the aberration therein.

The present aspect of the invention applies such new aberration-correction methods to make it possible to obtain a high-performance optical system. One such method is the weakened powers of opposing convex mirrors M2 and M3. Dividing the heretofore excessively strong power of a single convex mirror between two convex mirrors M2 and M3 allows control of the aberrations respectively produced thereat to the greatest extent possible.

Here, in projection optical system 8 in this aspect of the present invention, an aperture stop AS is located between convex mirror M3 and concave mirror M4 such that the following design condition is satisfied:

$$0.1 \leq x/L \leq 0.9 \qquad (1)$$

where x is the length along optical axis AX from the vertex of convex mirror M3 to aperture stop AS, and L is the length along optical axis AX from the vertex of convex mirror M3 to the vertex of concave mirror M4.

Arranging aperture stop AS in this way increases the latitude in the design of the optical path and increases the number of degrees of freedom permitted during optical design. As a result, satisfactory correction of off-axis aberration is permitted. Outside of the range allowed by design condition (1), aperture stop AS will approach mirror M3 or M4 somewhat too closely, this not being preferable from a design standpoint. In particular, correction of off-axis aberration will become difficult and mechanical interference problems will arise when attempting to arrange aperture stop AS. More satisfactory design performance can be obtained if the upper limit is made 0.7 and the lower limit is made 0.15.

It is preferable that aperture stop AS be arranged at a location such as will cause all effective light rays to be circularly shaped. Considering a case in which the present invention is applied to a projection exposure apparatus, it will be necessary that linewidth be made equal in the meridional and sagittal directions at second plane WP in which resides a wafer W having a photosensitive surface. To accomplish this, the pupil of the projection optical system 8 is made perfectly circular. Accordingly, it is preferable that all of the effective light rays passing through aperture stop AS be made to do so without being vignetted.

With continuing reference to FIG. 1, a second aberration-correction method involves control of the image plane, which is second plane WP. Because image plane WP should be as flat as possible even in optical systems employing annular apertures, it will first and foremost be necessary to keep the Petzval values produced by concave mirrors M1 and M4 as small as possible. Expressing this mathematically and taking the Petzval values of the two opposing concave mirrors to be respectively P1 and P4, it is preferable that the following design condition be satisfied:

$$-0.005 < (P1+P4) < 0.000. \qquad (2)$$

Violating the lower limit of condition (2) will cause image plane WP to become too curved (curvature of field) in a concave sense, exceeding a range such as will permit correction by convex mirrors M2 and M3. Violating the upper limit will cause the configuration of the optical system to depart from that of the present invention, making it impossible to obtain a high-performance projection optical system.

Next, the Petzval values produced by convex mirrors M2 and M3 must be made close in magnitude to the Petzval values produced by concave mirrors M1 and M4, but opposite in sign thereto. Furthermore, as described above, the powers of the two convex mirrors M2 and M3 must be made weak. It is thus preferable that the following design condition be satisfied:

$$0.000 < (P2+P3) < 0.005, \qquad (3)$$

wherein the Petzval values of opposing convex mirrors M2 and M3 are respectively P2 and P3.

Violating the upper limit of condition (3) will cause image plane WP to become too curved (curvature of field) in a convex sense, the amount thereof exceeding a range such as will permit correction by concave mirrors M1 and M4. Violating the lower limit will cause the configuration of the optical system to depart from that of the present invention, making it impossible to obtain a high-performance projection optical system.

It is also necessary to construct projection optical system 8 such that the Petzval values produced by concave mirrors M1 and M4 are canceled by convex mirrors M2 and M3. It is therefore preferable that the following design condition be satisfied:

$$-0.005 < (P1+P4)+(P2+P3) < 0.005. \qquad (4)$$

Violating the lower limit of condition (4) will cause image plane WP to become too curved (curvature of field) in a concave sense, exceeding a range such as will permit correction by convex mirrors M2 and M3. Violating the upper limit will cause image plane WP to become too curved (curvature of field) in a convex sense, the amount thereof exceeding a range such as will permit correction by concave mirrors M1 and M4.

By adopting a constitution such that these relationships are not violated, the present invention makes it possible to correct curvature of field at second (image) plane WP to the maximum extent possible.

A third aberration-correction method involves adopting a construction wherein all of the mirrors M1–M4 are rotationally symmetric aspheric surfaces to achieve an optical system displaying superior imaging performance. Employing higher-order aspheres that are rotationally symmetric about optical axis AX permits correction of higher-order aberrations produced at the several surfaces, allowing a high-performance optical system to be obtained. Working Examples for such a projection optical system are described below.

In addition, because image plane WP should be as flat as possible, a construction is adopted wherein the Petzval sum is made close to zero. In the present invention, adoption of a constitution such as is described above allows a superior catoptric reduction projection optical system to be obtained.

Second Aspect of Invention

Referring to FIG. 2, the configuration of a projection optical system according to a second aspect of the present invention is now described. FIG. 2 shows the optical path in a cross section of a catoptric reduction projection optical system 10 associated with a fourth embodiment of the present invention, to be described below. The width of the light beam shown in FIG. 2 is only that of the light beam within the cross section. The same reference symbols as those for projection optical system 8 of FIG. 1 are used where appropriate for the sake of convenience.

As shown in FIG. 2, a catoptric reduction projection optical system 10, according to the present aspect of the invention, has a basic constitution along optical axis AX comprising along an optical path from first plane RP to second plane WP a first mirror (concave mirror) M1 having a concavely shaped reflective surface, a second mirror M2 that is substantially planar but includes an aspherically shaped reflective surface of zero power in the paraxial region, a third mirror (convex mirror) M3 having a convexly shaped reflective surface, an aperture stop AS having an opening of prescribed dimensions, and a fourth mirror (concave mirror) M4 having a concavely shaped reflective surface, for forming in second plane WP a reduced image of a pattern (not shown) on a reticle R arranged in first plane RP. Here, using other words to describe the constitution of second mirror M2, second mirror M2 has an aspheric surface formed on a plane mirror. The plane mirror has zero power in the paraxial region (the region in the vicinity of optical axis AX), but has a prescribed weak power due to the aspheric surface in a region removed from and peripheral to the paraxial region.

First through fourth mirrors M1–M4 are respectively arranged at prescribed intervals along, and so as to be respectively coaxial with respect to, optical axis AX; i.e., the vertices (a vertex here being the point at which the reflective surface of a mirror intersects the reference axis of that mirror) of the several mirrors M1–M4 respectively lie on optical axis AX. This facilitates incorporation of the several mirrors M1–M4 in a lens barrel (not shown) and the adjustment thereof. Note that the "reference axis" of a reflective surface refers to the axis connecting the vertex of that reflective surface with the paraxial center of curvature of the reflective surface in question.

The constitution of projection optical system 10 described above makes it possible to set the position of aperture stop AS with a fair degree of latitude while maintaining objectwise and imagewise telecentricity. That is, when a light beam L1 from first plane RP is incident on catoptric reduction projection optical system 10, incident light beam L1 will be incident thereon such that it is directed at first mirror M1 in more or less telecentric fashion. That is, the principal ray thereof will be more or less parallel with respect to optical axis AX or with respect to a normal drawn to first plane RP. Furthermore, incident light L1 will be reflected by first mirror M1, will be reflected by second mirror M2 downstream therefrom, and will thereafter be incident on third mirror M3 downstream therefrom. Light beam L1 reflected from third mirror M3 will pass through the opening of aperture stop AS so as to cross optical axis AX, and will be incident on fourth mirror M4 downstream therefrom. Light beam L1 reflected by fourth mirror M4 will thereafter contribute to formation of an image on second (image) plane WP in substantially telecentric fashion. That is, the principal ray thereof will be substantially parallel with respect to optical axis AX or with respect to a normal drawn to second (image) plane WP.

Note that the objectwise telecentricity is somewhat inferior relative to the imagewise telecentricity due to the angle with which light beam L1 is incident on reticle R. This issue is related to the manner in which the illumination optical system (not shown), to be described below, interfaces with the projection optical system 10. Nonetheless, in the present invention, there is objectwise telecentricity when the distance along optical axis AX from first plane RP to the location of the entrance pupil of the catoptric reduction projection optical system 10 is 1.7 or more times the distance along optical axis AX from first (object) plane RP to second (image) plane WP.

At this time, more or less telecentric light beam L1 incident on first mirror M1 is reflected so as to be directed in more or less the direction of optical axis AX, and is incident on second mirror M2. Incident light beam L1 is then reflected in a direction opposite to the direction in which it was incident on second mirror M2, and is reflected toward aperture stop AS by third mirror M3 downstream therefrom so as to be in a direction opposite to the direction in which it was incident on mirror M3. By thrice folding light beam L1 from first plane RP back upon itself, first through third mirrors M1–M3 permit aperture stop AS to be arranged without vignetting light rays effective in image formation. This allows for space for aperture stop AS to be arranged.

Here, as previously mentioned, second mirror M2 has an aspheric surface formed on the reflective surface of a plane mirror. Second mirror M2 has zero power in the paraxial region of the reflective surface of that second mirror M2, but weak power due to the action of the aspheric surface in a region removed from and peripheral to the paraxial region of the reflective surface of second mirror M2. In the present aspect of the invention, second mirror M2 has a reflective surface comprising a weak aspheric surface formed from a more or less plane mirror. Were second mirror M2 to be constituted simply from a plane mirror, correction of aberration would be problematic, and it would not be possible to adequately maintain optical imaging performance in catoptric reduction projection optical system 10.

In the present aspect of the invention, if second mirror M2 were to possess positive or negative power in the paraxial region, aberrational symmetry of the overall catoptric reduction projection optical system 10 would deteriorate, resulting in poor aberration balance. This would make it difficult to achieve satisfactory imaging performance. In such a case, it would be difficult to arrange aperture stop AS without blocking light rays effective in image formation.

Constructing catoptric reduction projection optical system 10 as described above makes it possible to maintain a markedly high level of aberrational correction capability. This is because aperture stop AS can be arranged freely at a desired location without eclipsing light rays effective in image formation while maintaining the symmetry of the various aberrations in the overall catoptric reduction projection optical system 10, ensuring a satisfactory aberration balance.

With continuing reference to FIG. 2, catoptric reduction projection optical system 10 of the present aspect of the invention is constituted such that, taking the distance along optical axis AX from the vertex of third mirror M3 to aperture stop AS to be x, and taking the distance along optical axis AX from the vertex of third mirror M3 to the vertex of fourth mirror M4 to be L, it is preferable that the following design condition be satisfied:

$$0.1 < x/L < 0.7. \tag{5}$$

Satisfaction of condition (5) will adequately ensure that aperture stop AS in catoptric reduction projection optical system 10 can be arranged without blocking light rays effective in image formation.

If the lower limit of condition (5) is violated, aperture stop AS will eclipse light rays (lower light rays) reflected from second mirror M2. Furthermore, it is not preferable that the upper limit of design condition (5) be violated, since this will cause aperture stop AS to eclipse light rays (upper light rays) reflected from the fourth mirror M4.

In the design described above, the dimensions of the opening of aperture stop AS may be made to accommodate and admit the entire cross section of the light beam passing therethrough. An ordinary aperture stop construction may also be employed. To adequately ensure perfect imagewise telecentricity or more or less near-perfect imagewise telecentricity, it is preferable that the position of aperture stop AS in the direction of optical axis AX be set so as to obtain imagewise telecentricity.

To achieve more adequate optical imaging performance in catoptric reduction projection optical system 10, it is preferable that sufficient control of image plane WP be carried out.

In a projection optical system in which an arcuate image plane zone (or ringfield image plane zone) is formed with satisfactory aberration over an arcuate region (or ringfield) at a certain image height, it is desirable that not only the arcuate image plane zone (or ringfield image plane zone) but the entire image plane be made as flat as possible.

To achieve this, the Petzval sum produced by first mirror M1, third mirror M3, and fourth mirror M4 of catoptric reduction projection optical system 10 must be kept as small as possible.

Taking the Petzval curvatures at the paraxial region of first mirror M1, third mirror M3, and fourth mirror M4 to be respectively be P1, P3, and P4, it is preferable that the following design condition be satisfied:

$$-0.005 < (P1+P3+P4) < 0.005. \tag{6}$$

Here, if the lower limit of condition (6) is violated, second (image) plane WP formed at wafer W will be too curved in a concave sense. This would cause the amount of curvature of field produced at second (image) plane WP to greatly exceed a range such as will permit correction by catoptric reduction projection optical system 10, leading to deterioration of the image. Furthermore, if the upper limit of condition (6) is violated, second (image) plane WP will become too curved (curvature of field) in a convex sense. This would cause the amount of curvature of field produced at second (image) plane WP to greatly exceed a range such as will permit correction by catoptric reduction projection optical system 10, leading to deterioration of the image.

In the present aspect of the invention, in addition to forming an aspherical second mirror M2, it is preferable that first mirror M1, third mirror M3, and fourth mirror M4 also be aspherically shaped. That is, it is preferable that all of the mirrors making up the catoptric reduction projection optical system be made aspheric. This will permit well-balanced correction of higher-order aberration produced by the several mirrors M1–M4, allowing for even more satisfactory imaging performance.

In the present aspect of the invention, it is preferable that first and third mirrors M1, M3 be respectively set such that the reflective surfaces thereof face first plane RP, and second and fourth mirrors M2, M4 be respectively set such that the reflective surfaces thereof face second plane WP. In particular, it is still more preferable that first through fourth mirrors M1–M4 be respectively arranged so as to cause the vertex of first mirror M1 and the vertex of second mirror M2 to be located between the vertex of third mirror M3 and the vertex of fourth mirror M4. That is, it is still more preferable that first through fourth mirrors M1–M4 be respectively arranged such that third mirror M3 and fourth mirror M4 straddle first mirror M1 and second mirror M2 in the optical axis AX direction. This permits reduction of the distance between first plane RP and second plane WP and permits attainment of compactness in the size of catoptric reduction projection optical system 10.

Furthermore, it is preferable in the present invention that catoptric reduction projection optical system 10 be constituted so as to basically comprise only four mirrors M1–M4. This makes it possible to ensure that there will be an adequate amount of light in practice when catoptric reduction projection optical system 10 of the present invention is applied to a projection exposure apparatus employing actinic light in the soft x-ray region of wavelength 5 to 15 nm (such light is referred to hereinafter as "EUV" (extreme ultraviolet) light) or in the hard x-ray region having shorter wavelengths, even when reflectance of reflective coatings in the corresponding wavelength domain is low. Moreover, because the number of reflective surfaces is small, there is less chance of deterioration in imaging performance due to errors in the reflective surfaces.

Exposure Apparatus and Method

Referring to FIG. 3, now described is a projection exposure apparatus EX incorporating catoptric reduction projection optical system 8 or 10, as described above, generally referred to now as projection optical system PL.

Projection exposure apparatus EX employs EUV light exposure light. Exposure is carried out using a step and scan method. In FIG. 3, the Z direction is in the direction of optical axis AX of the catoptric reduction projection optical system PL. Reflection-type reticle R serves as the object to be projected onto photosensitive substrate (e.g., wafer) W. The Y direction is in the plane of the paper and perpendicular to the Z direction. The X direction is perpendicular to the Y and Z directions.

Reticle R and wafer W are relatively scanned in a unidimensional direction (here, the direction of the Y axis) with respect to catoptric reduction projection optical system PL while an image of a portion of a circuit pattern (not shown) drawn on reticle R is projected onto wafer W via catoptric reduction projection optical system PL. Projection exposure apparatus EX thus transfers the entire circuit pattern to each of a plurality of exposure fields EF on wafer W.

Because the transmittance of EUV light is low in air, the optical path along which the EUV light travels is preferably enclosed by a vacuum chamber VC and shielded (i.e., kept under vacuum) from the outside atmosphere.

With continuing reference to FIG. 3, an illumination optical system IS of projection exposure apparatus EX is now described. Illumination system IS comprises a laser light source 30 capable of supplying laser light L0 of wavelength in the infrared to visible region. An exemplary light source 30 is a semiconductor-laser-excitation YAG laser, excimer laser, or the like. Laser light L0 is collected by a collector optical system 31 at a location 32. A nozzle 33 sprays a gaseous substance (not shown) toward location 32. This sprayed substance receives high-intensity laser light at location 32. This causes the temperature of the sprayed substance to become elevated by the energy of laser light L0. The sprayed substance then becomes excited and assumes a plasmic state. EUV light L2 is released during the transition to a lower potential state.

Surrounding location 32 is arranged an elliptical mirror 34 with an inner surface 34S constituting a collector optical system. Elliptical mirror 34 is positioned such that a first focus f1 thereof more or less coincides with location 32. A multilayer film for reflecting EUV light is provided on inner surface 34S of elliptical mirror 34. EUV light L2 is reflected from inner surface 34S and is collected at a second focus f2 of the elliptical mirror 34 and is thereafter directed toward a parabolic mirror 35 having an inner surface 35S serving as a collimating mirror constituting a collector optical system. Parabolic mirror 35 is positioned such that a focus f3 thereof more or less coincides with second focus f2 of the elliptical mirror 34. Inner surface 35S is also provided with a multilayer film for reflecting EUV light L2.

EUV light L2 exiting parabolic mirror 35 is directed in more or less collimated fashion toward a reflection-type fly-eye optical system 36 serving as optical integrator. Reflection-type fly-eye optical system 36 consists of a first reflective element group 36a having a collection of a plurality of reflective surfaces, and a second reflective element group 36b having a plurality of reflective surfaces corresponding to the plurality of reflective surfaces of first reflective element group 36a. The pluralities of reflective surfaces constituting first and second reflective element groups 36a, 36b are also provided with multilayer films for reflecting EUV light L2.

Collimated EUV light L2 from parabolic mirror 35 is split into a number of wavefronts by first reflective element group 36a. EUV light L2 from the several reflective surfaces is then collected to form a plurality of light source images (not shown). The plurality of reflective surfaces of second reflective element group 36b are respectively positioned in the vicinities of the locations at which this plurality of light source images are formed. The plurality of reflective surfaces of second reflective element group 36b substantially function as field mirrors. Reflection-type fly-eye optical system 36 thus forms a multiplicity of light source images serving as secondary light source from the roughly parallel light rays from parabolic mirror 35. Such a reflection-type fly-eye optical system 36 has been proposed by the present applicant in Japanese Patent Application No. H10[1998]-47400.

In the present mode for carrying out the invention, a σ stop AS' serving as a first aperture stop is provided in the vicinity of second reflective element group 36b to control the dimensions of the secondary light source. This σ stop AS' comprises, for example, a plurality of openings (not shown) having mutually different dimensions provided on a turret. Control of which opening is to be arranged in the optical path is carried out by σ stop control unit ASC1, which is in operable communication with σ stop AS'.

EUV light L2 from the secondary light source formed by reflection-type fly-eye optical system 36 is directed toward condenser mirror 37 positioned such that the focus thereof is in the vicinity of this secondary light source. EUV light L2 is then reflected and collected by condenser mirror 37, and thereafter arrives at a reticle R by way of an optical path folding mirror 38. The surfaces of condenser mirror 37 and optical path folding mirror 38 are provided with multilayer films for reflecting EUV light L2. Moreover, condenser mirror 37 collects EUV light emanating from the secondary light source and uniformly illuminates reticle R in a superimposed fashion.

Catoptric reduction projection optical system PL in the present mode for carrying out the invention is more or less objectwise telecentric. However, because it is not perfectly objectwise telecentric, spatial separation of the optical paths of EUV light L2 directed toward reticle R and the image-forming light reflected by reticle R and directed toward catoptric reduction projection optical system PL is possible.

A reflective film comprising a multilayer film for reflecting EUV light L2 is provided on reticle R. This reflective film is a pattern corresponding to the dimensions of a pattern to be transferred to a wafer W. EUV light L2 reflected by reticle R contains information related to the pattern on reticle R. This light is then incident on catoptric reduction projection optical system PL.

As described above, catoptric reduction projection optical system PL comprises a structure having four mirrors M1–M4, and variable aperture stop AS. The latter serves as a second aperture stop, and is arranged in the optical path between mirror M3 and mirror M4, at a location where a principal ray proceeding along the optical path between mirror M3 and mirror M4 would intersect optical axis AX. That is, variable aperture stop AS is set such that the center of the opening thereof coincides with the optical axis AX. Here, variable aperture stop AS is constructed such that the size of the opening thereof can be varied by variable aperture stop control unit ASC2 in operable communication therewith.

Mirrors M1–M4 making up the catoptric reduction projection optical system PL comprise prescribed substrates whereon multilayer films that reflect EUV light L2 have been provided.

EUV light L2 reflected by reticle R travels through catoptric reduction projection optical system PL to form, on an arcuate exposure region ER on wafer W, a reduced image of the pattern on reticle R. This reduction is a prescribed by reduction factor β (where |β| is, for example, equal to ¼, ⅕, or ⅙). Moreover, whereas it is preferable in the embodiment shown in FIG. 2 that a field stop for defining the arcuate exposure region be arranged in the vicinity of reticle R, when arrangement of this field stop in the vicinity of the reticle R is problematic, it is desirable that this field stop be arranged at a location optically conjugate to reticle R in the illumination optical path of illumination optical system IS.

With continuing reference to FIG. 3, reflection-type reticle R is supported by a reticle stage RS capable of motion in at least the Y direction, and wafer W is supported by a wafer stage WS capable of motion in the X, Y, and Z directions. Motion of reticle stage RS and wafer stage WS are respectively controlled by a reticle stage control unit RSC and a wafer stage control unit WSC, respectively in operable communication with reticle stage RS and wafer stage WS. During exposure operations, reticle R and wafer W are made to move relative to catoptric reduction projection optical system PL at a prescribed speed ratio determined by the reduction factor of the projection optical system while the illumination optical system irradiates reticle R with EUV light L2. As a result, the pattern of reticle R is scanned and exposed onto wafer W within exposure field EF.

In the present mode for carrying out the invention it is preferable that the σ stop AS', the variable aperture stop AS and the field stop comprise a metal such as Au, Ta, W, or the like so as to adequately block EUV light.

Furthermore, multilayer films serving as reflective films for reflecting EUV light are formed on the reflective surfaces of mirrors M1–M4, described above. These multilayer films are formed by lamination of a plurality of substances chosen from among molybdenum, ruthenium, rhodium, silicon, and silicon oxides.

Embodiments of First Aspect of Invention

Below, referring now to FIG. 1 and FIGS. 4a–8c, first through third embodiments according to a first aspect of the present invention are now described.

Referring again to FIG. 1, a first embodiment is a projection optical system 8, described above, having a (reducing) magnification of ¼, a numerical aperture NA at second plane WP side of 0.1, a maximum object height of 60.5 mm, and an exposure size such that an annular aperture of radius 60 mm and width 1 mm is used to carry out scanned exposure for a total exposure field EF area of 26 mm×33 mm.

The surface-to-surface distance between first (reticle) plane RP and second (image) plane WP is 1500 mm, and the maximum effective diameter of the mirrors used is 335 mm.

Figure 4A:
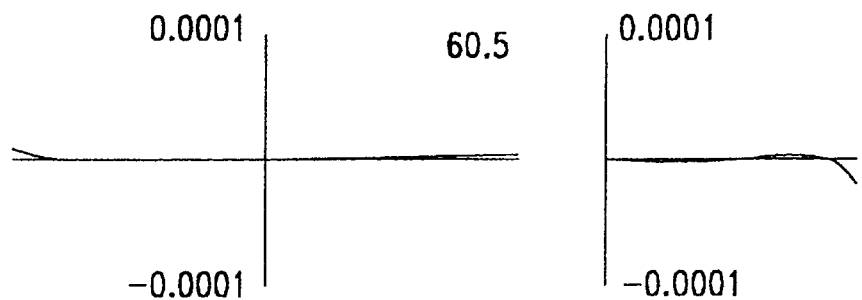
FIGS. 4a–4c are transverse aberration curves (meridional and sagittal) for a Working Example 1 according to the first embodiment of FIG. 1.
Figure 4B:
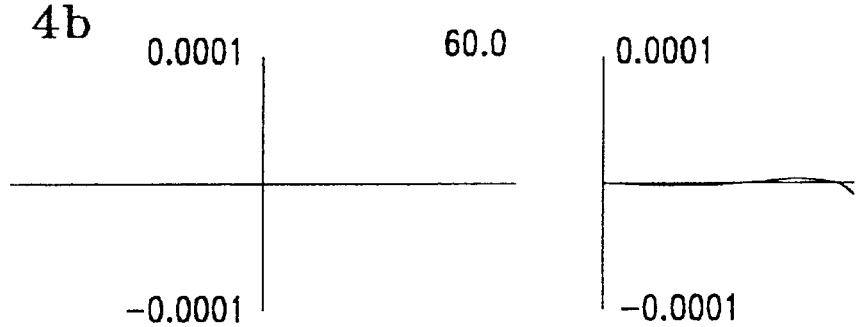
Figure 4C:
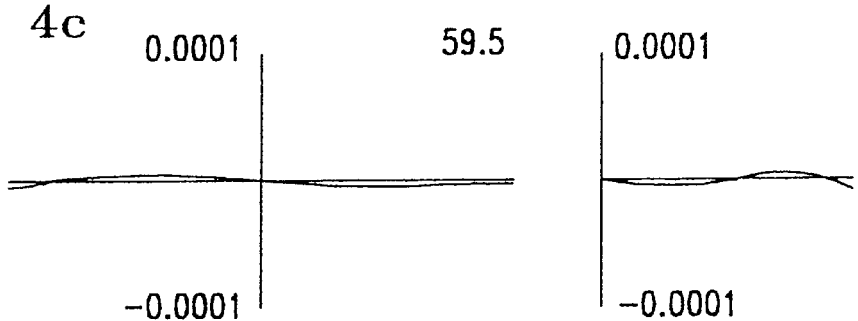

From FIGS. 4a–4c, it is clear that projection optical system 8 displays superior imaging performance, with spherical aberration and coma being satisfactorily corrected to the point where both are almost completely absent, more or less, at monochromatic wavelength 13.4 nm for use in EUV lithography. Distortion within the ringfield used is also satisfactorily corrected. In FIGS. 4a–4c, the aberration plots on the left are in the meridional direction, and the aberration plots on the right are in the sagittal direction. Furthermore, in FIG. 4a the image height is 60.5, in FIG. 4b the image height is 60.0, and in FIG. 4c the image height is 59.5.

Mirrors M1–M4 herein all consist of rotationally symmetric aspheric surfaces. Data pertaining to a Working Example 1 of the present embodiment is presented in Tables 1A through 1D, below.

Figure 5:
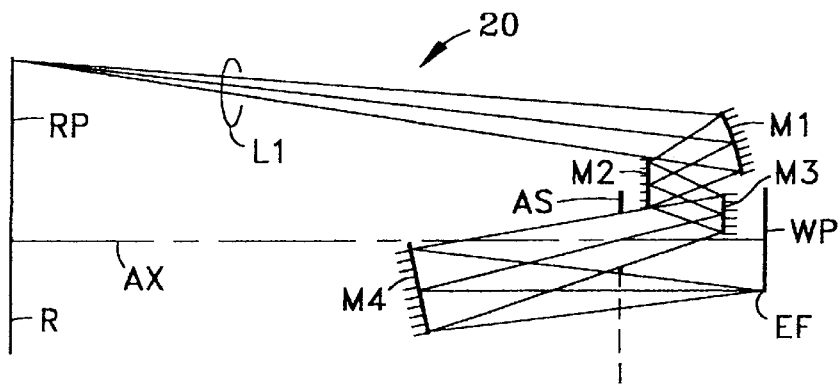
FIG. 5 is a cross-sectional schematic optical diagram of a projection optical system of a second embodiment according to a first aspect of the present invention.

Referring now to FIG. 5, a second embodiment is a projection optical system 20 similar to projection optical system 8, and having a (reducing) magnification of ¼ and constituted along optical axis AX, such that there are therein, after first plane RP and in order along the optical path, a first concave mirror M1, mutually opposing convex mirrors M2 and M3, an aperture stop AS, and a second concave mirror M4 that forms an image on second plane WP.

Projection optical system 20 has a (reducing) magnification of ¼, a numerical aperture NA at the second plane WP side of 0.13, a maximum object height of 90.5 mm, and an exposure size such that an annular aperture of radius 90 mm and width 1 mm is used to carry out scanned exposure for a total exposure field EF area of 26 mm×33 mm.

The surface-to-surface distance between first (reticle) plane RP and second (image) plane WP is 1489 mm, and the maximum effective diameter of the mirrors used is 444 mm.

Figure 6A:
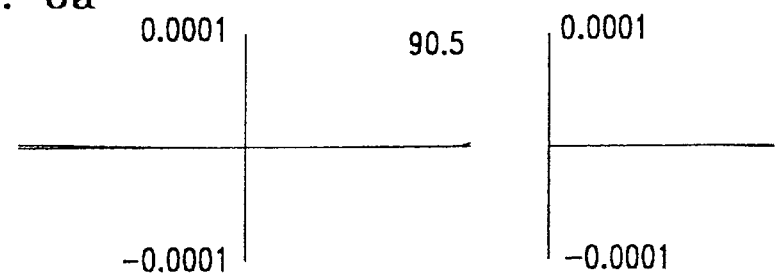
FIGS. 6a–6c are transverse aberration curves (meridional and sagittal) for a Working Example 2 according to the second embodiment of FIG. 5.
Figure 6B:
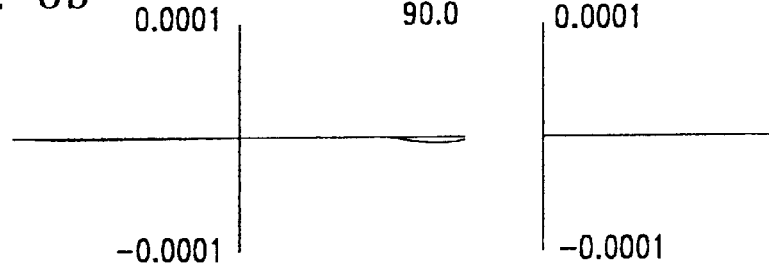
Figure 6C:
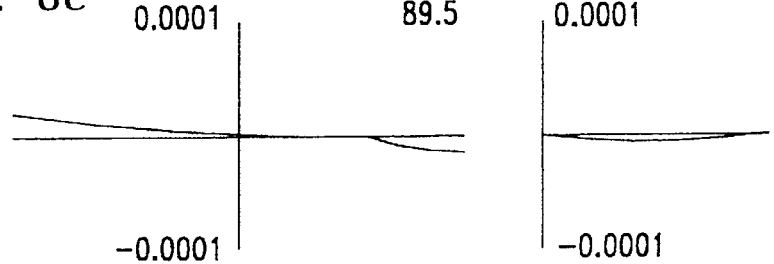

From FIGS. 6a–6c, it is clear that projection optical system 20 displays superior imaging performance, with spherical aberration and coma being satisfactorily corrected to the point where both are almost completely absent, more or less, at monochromatic EUV wavelength 13.4 nm. Distortion within the ringfield used is also satisfactorily corrected. In FIGS. 6a–6c, the aberration plots on the left are in the meridional direction, and the aberration plots on the right are in the sagittal direction. Furthermore, in FIG. 6a the image height is 90.5, in FIG. 6b the image height is 90.0, and in FIG. 6c the image height is 89.5.

Mirrors M1–M4 have rotationally symmetric aspheric surfaces. Data pertaining to a Working Example 2 of the present embodiment is presented in Tables 2A through 2D, below.

Figure 7:
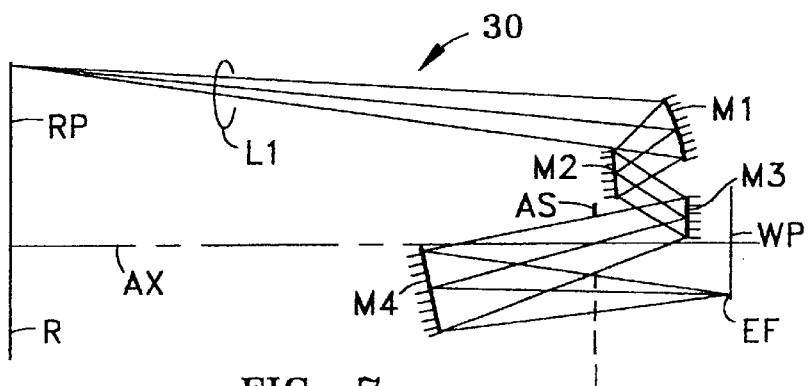
FIG. 7 is a cross-sectional schematic optical diagram of a projection optical system of a third embodiment according to a first aspect of the present invention.

Referring now to FIG. 7, a third embodiment is a projection optical system 30 having a (reducing) magnification of ¼ and constituted along optical axis AX, such that there are therein, after first plane RP and in order along the optical path, a first concave mirror M1, mutually opposing convex mirrors M2 and M3, an aperture stop AS, and a second concave mirror M4 that forms an image on second plane WP.

Projection optical system 30 has a (reducing) magnification of ¼, a numerical aperture NA at second plane WP side of 0.16, a maximum object height of 112.5 mm, and exposure size such that an annular aperture of radius 111 mm and width 1 mm is used to carry out scanned exposure for a total exposure field EF area of 26 mm×33 mm.

The surface-to-surface distance between first plane RP and second plane WP is 1456 mm, and the maximum effective diameter of the mirrors used is 553 mm.

Figure 8A:
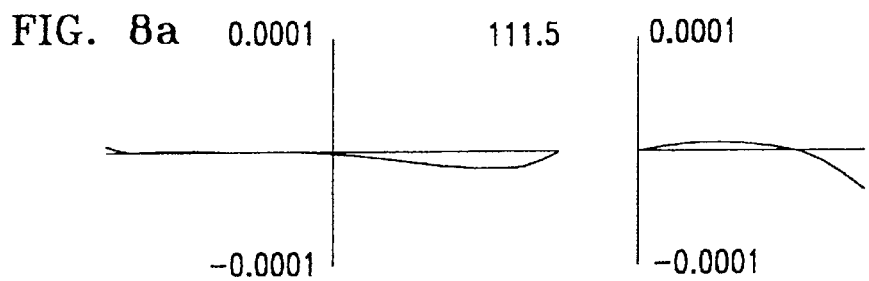
FIGS. 8a–8c are transverse aberration curves (meridional and sagittal) for a Working Example 3 of the third embodiment of FIG. 7.
Figure 8B:
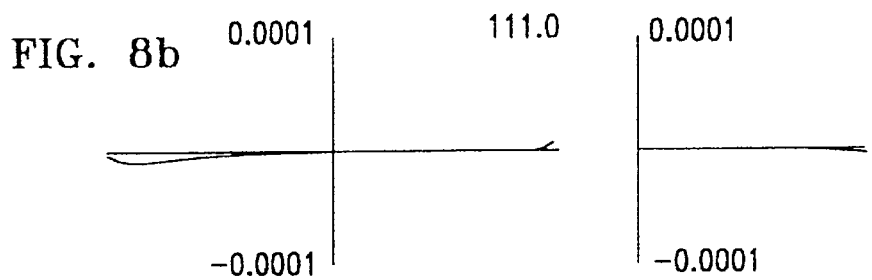
Figure 8C:
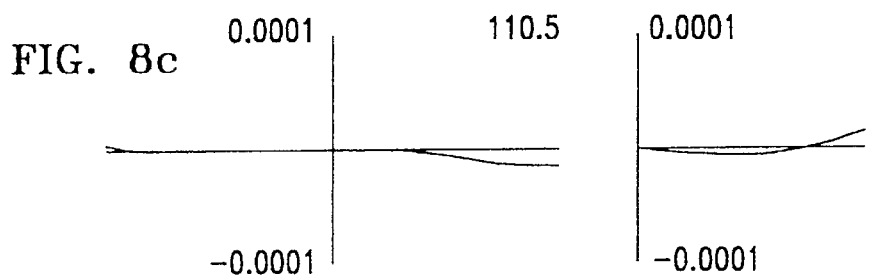

From FIGS. 8a–8c, it is clear that projection optical system 30 displays superior performance, spherical aberration and coma being satisfactorily corrected to the point where both are almost completely absent, more or less, at monochromatic EUV wavelength 13.4 nm. Distortion within the ringfield used is also satisfactorily corrected. In FIGS. 8a–8c, the aberration plots on the left are in the meridional direction, and the aberration plots on the right are in the sagittal direction. Furthermore, in FIG. 8a the image height is 111.5, in FIG. 8b the image height is 111.0, and in FIG. 8c the image height is 110.5.

Mirrors M1–M4 have rotationally symmetric aspheric surfaces. Data pertaining to a Working Example 3 of the present embodiment is presented in Tables 3A through 3D, below.

As described above, in contrast to the so-called Offner-type catoptric imaging optical system consisting of a single convex mirror between two concave mirrors, the several exemplary embodiments according to the first aspect of the invention employ two convex mirrors instead of a single convex mirror. This alleviates the sagittal coma and meridional coma liable to be produced by a single convex mirror.

Such a construction would normally cause light rays to be reflected far off-axis by the two convex mirrors. However, through careful selection and distribution of power this problem is alleviated in this aspect of the invention. At the same time, receipt of such light rays by concave mirrors M1 and M4 controls off-axis aberration to the greatest extent possible, and also corrects for distortion. Moreover, because all of the mirrors consist of rotationally symmetric aspheric surfaces, an optical system having superior imaging performance is obtained.

It is clear from Tables 1D, 2D, and 3D, below, that Working Examples 1 through 3 of the first through third embodiments satisfy the design conditions and have a satisfactory flat image plane (i.e., minimal curvature of field).

Embodiments of Second Aspect of Invention

Below, referring to FIG. 2 and FIGS. 9a–11c, fourth and fifth embodiments according to a second aspect of the present invention are now described.

Figure 10:
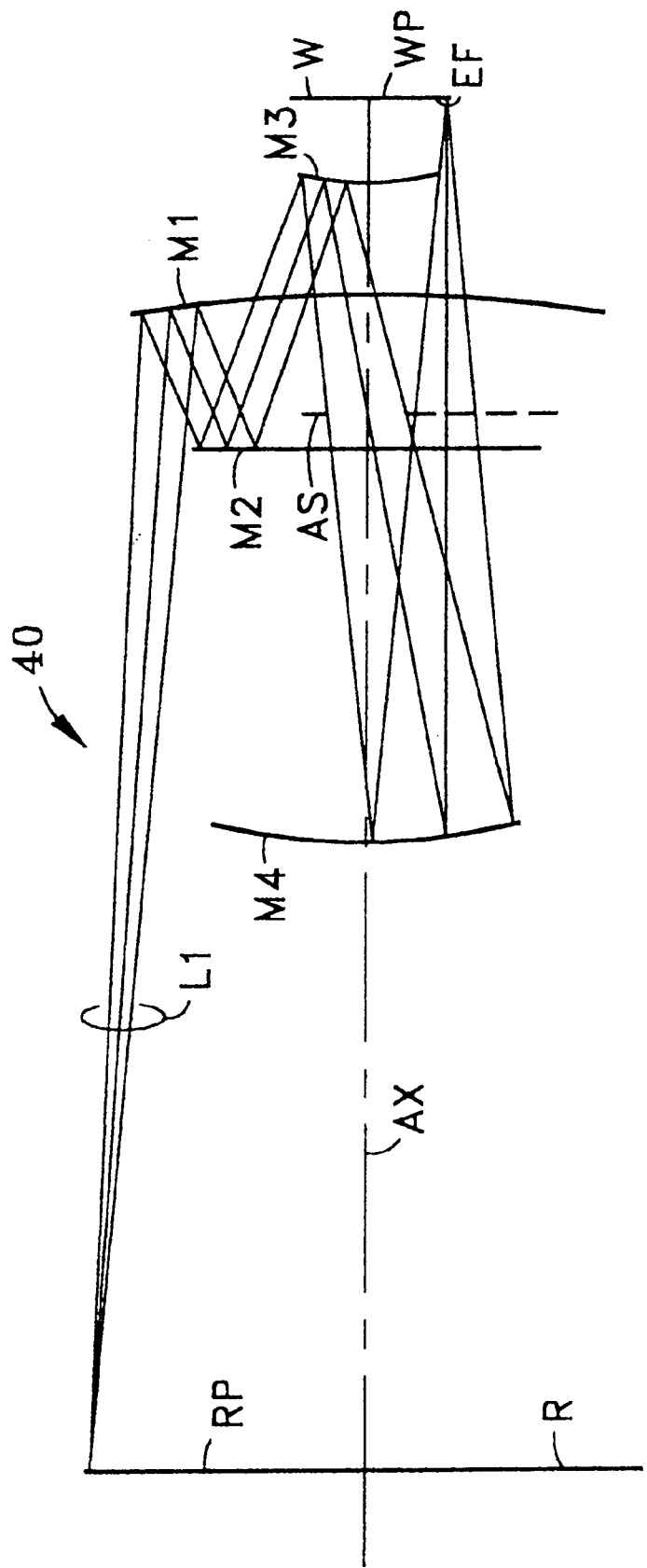
FIG. 10 is a cross-sectional schematic optical diagram of a catoptric reduction projection optical system in a fifth embodiment according to a second aspect of the present invention.

Catoptric reduction projection optical system 10, shown in FIG. 2 and described above in connection with the second aspect of the invention, is described in further detail here as a fourth embodiment of the present invention. Catoptric reduction projection optical system 40 of FIG. 10 is a fifth embodiment according to the second aspect of the present invention.

Catoptric reduction projection optical systems 10 and 40 of the fourth and fifth embodiments, respectively, form in second plane WP a reduced image of an object in first plane RP. Each of projection optical system 10 and 40 comprise first mirror M1 having a concavely shaped reflective surface at the first plane RP side thereof, second mirror M2 having an aspherically shaped reflective surface with no refracting or diverging power paraxially, third mirror M3 having a convexly shaped reflective surface at the first plane RP side thereof, and a fourth mirror (concave mirror) M4 having a concavely shaped reflective surface at the second plane WP side thereof.

Here, as described above, the reflective surface of the second mirror (plane mirror having aspheric surface) M2 is formed in the shape of an asphere that is rotationally symmetric about optical axis AX. Moreover, first mirror (concave mirror) M1, third mirror (convex mirror) M3, and fourth mirror (concave mirror) M4 are respectively rotationally symmetric aspheres about optical axis AX.

Furthermore, mirrors M1–M4 are arranged along a common optical axis AX so as to be mutually coaxial. Aperture stop AS is arranged at a location on optical axis AX in the optical path between third mirror M3 and fourth mirror M4.

As described above, the several mirrors M1–M4 in the fourth and fifth embodiments have aspherically shaped surfaces, the shapes of these aspheres being given by the formula in the Working Examples section, below.

Also, in catoptric reduction projection optical system 10 of the fourth embodiment, the EUV light wavelength (exposing wavelength) is 13.4 nm, the reduction factor |β| is ¼, the NA at the image side is 0.1, the maximum object height is 200 mm, and the ringfield exposure area has width 1 mm and radius 50 mm. Here, an exposure field EF that is 26 mm×33 mm overall can be exposed by carrying out a scanned exposure. Furthermore, the distance between first (object) plane RP and second (image) plane WP is 998.7 mm. The largest of the effective diameters of mirrors M1–M4 is 300 mm.

In the catoptric reduction projection optical system 40 of the fifth embodiment, the EUV light wavelength (exposing wavelength) is 13.4 nm, the reduction factor |β| is ¼, the NA at the image side is 0.1, the maximum object height is 200 mm, and the ringfield exposure area has width 1 mm and radius 50 mm. Here, an exposure field EF that is 26 mm×33 mm overall can be exposed by carrying out a scanned exposure. Furthermore, the distance between first (object) plane RP and second (image) plane WP is 871.4 mm. The largest of the effective diameters of mirrors M1–M4 is 289.5 mm.

Design values pertaining to the catoptric reduction projection optical systems 10 and 40 corresponding to Working Examples 4 and 5 are presented in Tables 4A, 4B, and 5A, 5B, below. Tables 4C and 5C list aspheric data for mirrors M1–M4. Values corresponding to design conditions for the catoptric reduction projection optical systems 10 and 40 in Working Examples 4 and 5 are presented in Tables 4D and 5D, below.

Figure 9A:
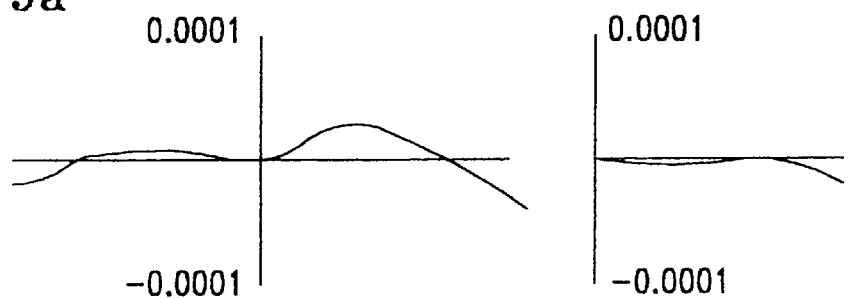
FIGS. 9a–9c are coma curves (meridional and sagittal) for a Working Example 4 of the fourth embodiment of FIG. 2.
Figure 9B:
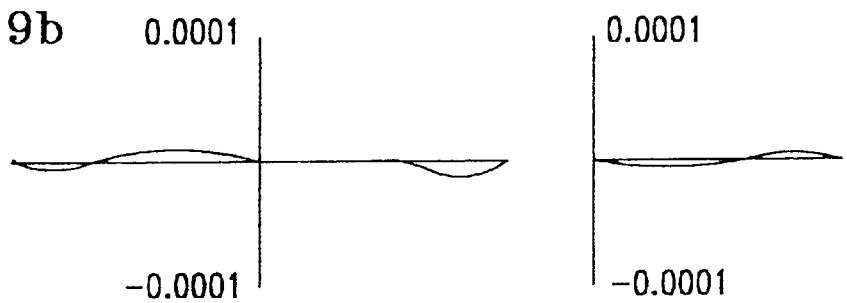
Figure 9C:
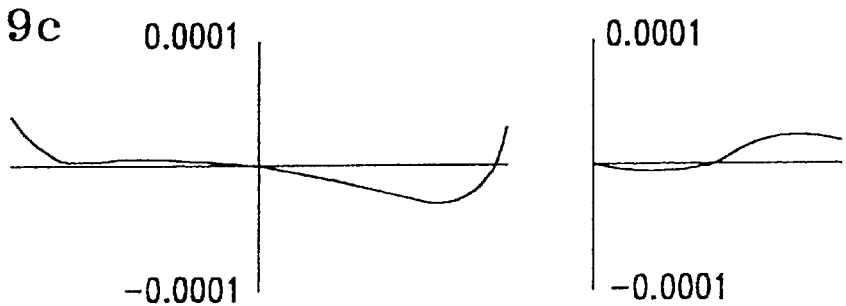
Figure 11A:
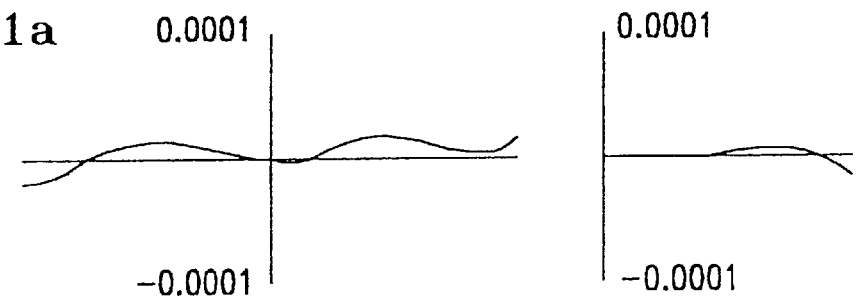
FIGS. 11a–11c are coma curves (meridional and sagittal) for a Working Example 5 of the fifth embodiment of FIG. 10.
Figure 11B:
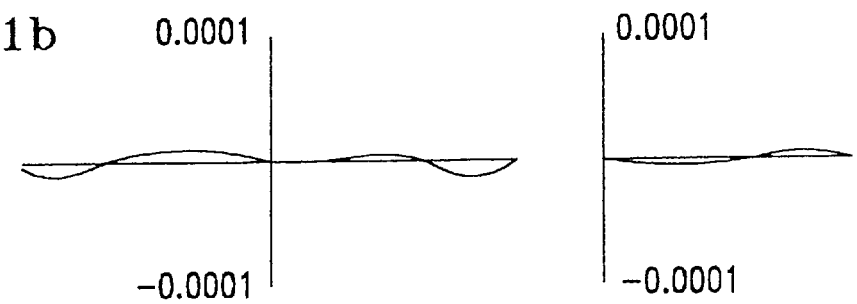
Figure 11C:
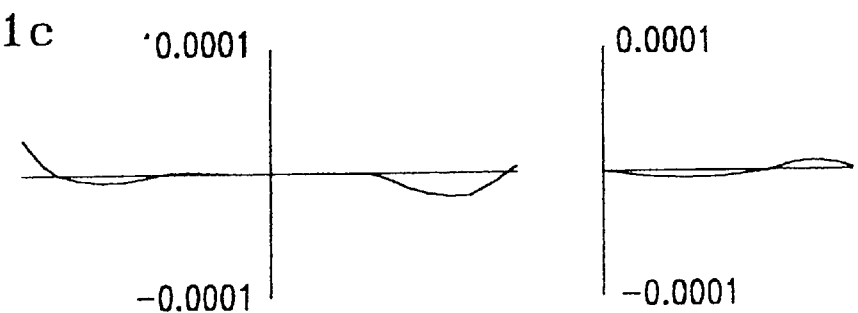

Curves showing coma for the catoptric reduction projection optical systems 10 and 40 in Working Examples 4 and 5 are respectively presented in FIGS. 9a–9c and 11a–11c. These coma curves were obtained by ray tracing from second plane WP side using light of wavelength 13.4 nm. Here, FIG. 9a are coma curves in the meridional and sagittal directions, respectively, for object height Y=202 mm; FIG. 9b are coma curves in the meridional and sagittal directions, respectively, for object height Y=200 mm; and FIG. 9c are coma curves in the meridional and sagittal directions, respectively, for object height Y=198 mm. Likewise, FIG. 11a are coma curves in the meridional and sagittal directions, respectively, for object height Y=202 mm; FIG. 11b are coma curves in the meridional and sagittal directions, respectively, for object height Y=200 mm; and FIG. 11c are coma curves in the meridional and sagittal directions, respectively, for object height Y=198 mm.

As is clear from FIGS. 9a–9c and 11a–11c, the catoptric reduction projection optical systems 10 and 40 in Working Examples 4 and 5 of the fourth and fifth embodiments are satisfactorily corrected to the point where the optical system is more or less aplanatic, spherical aberration and coma both being almost completely absent, for EUV light at a monochromatic wavelength of 13.4 nm, and distortion within the exposure region is satisfactorily corrected.

WORKING EXAMPLES

Design specification values pertaining to Working Examples 1–5 of the embodiments according to first and second aspects of the present invention are presented in Tables 1A through 5D, below. Specifically, Working Examples 1 through 3, design values for which are presented in Tables 1A through 3D, respectively pertain to first through third embodiments according to the first aspect of the invention. Working Examples 4 and 5, design values for which are presented in Tables 4A through 5D, respectively pertain to fourth and fifth embodiments according to a second aspect of the invention. Working Examples 1–5 are representative of catoptric reduction projection optical systems 8, 20, 30, 10 and 40 shown in FIGS. 1, 5, 7, 2, and 10, respectively.

In Tables 1A, 2A, and 3A, the symbols r1, r2, r3, and r4 are respectively the radii of curvature of the first concave mirror M1, the first convex mirror M2, the second convex mirror M3, and the second concave mirror M4. The symbols K1, K2, K3, and K4 are respectively the curvatures of the first concave mirror M1, the first convex mirror M2, the second convex mirror M3, and the second concave mirror M4. The signs of these radii of curvature r1, r2, r3, and r4 and these curvatures K1, K2, K3, and K4 are taken to be positive for surfaces that are convex as viewed from the first plane RP side.

In Tables 1B, 2B, 3B, 4B, and 5B, the surface numbers of the reflective surfaces are listed in the column at far left, radii of curvature of the optical surfaces are listed under RDY, and distances between reflective surfaces are listed under THI. Moreover, the RDY column lists paraxial radii of curvature of reflective surfaces, and the THI column lists distances between surfaces. Furthermore, in Tables 4A and 5A, D0 is distance from the first plane RP (reticle surface) to the optical surface closest to the first plane RP side, WD is distance from the optical surface closest to the second plane WP side to second plane WP, β, is the lateral magnification of the catoptric reduction projection optical system when light is incident on the catoptric reduction projection optical system from the first plane RP side, and NA is numerical aperture at the second plane WP side. In Tables 1B, 2B, 3B, 4B, and 5B, the sign of paraxial radius of curvature RDY is taken to be positive for surfaces that are convex as viewed from the first plane RP side, and the sign of intersurface distance THI is inverted with each successive reflective surface.

Mirrors M1–M4 in Working Examples 1 through 5 have aspherically shaped surfaces, the shapes of these aspheres being given by the following formula.

$$Y = \frac{cr^2}{1 + \sqrt{1 - (1+k)c^2 r^2}} + Ar^4 + Br^6 + Cr^8 + Dr^{10}$$

Here, Y is distance from center tangent plane to aspheric surface, c is center curvature (center curvature in paraxial region), r is distance from optical axis, k is conic constant, A is fourth-order aspheric coefficient, B is sixth-order aspheric coefficient, C is eighth-order aspheric coefficient, and D is tenth-order aspheric coefficient.

TABLE 1A

DESIGN VALUES FOR WORKING EXAMPLE 1

| | |
|---|---|
| r1 | −872 |
| r2 | −1894 |
| r3 | 487.5 |
| r4 | 687 |
| K1 | −0.00115 |
| K2 | −0.000528 |
| K3 | 0.00205 |
| K4 | 0.00146 |

TABLE 1B

MORE DESIGN VALUES FOR WORKING EXAMPLE 1

| Surface No. | RDY | THI | |
|---|---|---|---|
| 0 | | 1474.688780 | R |
| 1 | −871.84140 | −159.812984 | M1 |
| 2 | −1894.01300 | 128.062415 | M2 |
| 3 | 487.47890 | −169.0000000 | M3 |
| 4 | | −342.106767 | AS |
| 5 | 687.16284 | 568.178834 | M4 |

TABLE 1C

ASPHERIC DATA FOR WORKING EXAMPLE 1

| Surface | 1 | 2 | 3 | 5 |
|---|---|---|---|---|
| k | −0.457980 | 40.021760 | −2.882965 | 0.211737 |
| A | −0.164768×10⁻¹⁰ | 0.103412× 10⁻⁸ | 0.541764× 10⁻⁸ | −0.284804×10⁻¹⁰ |
| B | −0.334226×10⁻¹⁵ | −0.496949×10⁻¹⁵ | 0.557637×10⁻¹⁴ | −0.433530×10⁻¹⁶ |
| C | 0.363279×10⁻²⁰ | 0.217517×10⁻¹⁸ | 0.255260×10⁻¹⁷ | −0.243275×10⁻²¹ |
| D | −0.270219×10⁻²⁵ | −0.380199×10⁻²³ | −0.210921×10⁻²¹ | 0.422095×10⁻²⁶ |

TABLE 1D

VALUES CORRESPONDING TO CONDITIONS FOR WORKING EXAMPLE 1

| | |
|---|---|
| x/L | 169/511.106767=0.33 |
| (P1 + P4) | −0.00261 |
| (P2 + P3) | 0.002578 |
| (P1 + P4) + (P2 + P3) | −0.000024 |

TABLE 2A

DESIGN VALUES FOR WORKING EXAMPLE 2

| | |
|---|---|
| r1 | −811 |
| r2 | −1473 |
| r3 | 520.5 |
| r4 | 708.6 |
| K1 | −0.00123 |
| K2 | −0.000679 |
| K3 | 0.00192 |
| K4 | 0.00141 |

TABLE 2B

MORE DESIGN VALUES FOR WORKING EXAMPLE 2

| Surface No. | RDY | THI | |
|---|---|---|---|
| 0 | | 1446.494640 | R |
| 1 | −811.30103 | −137.292540 | M1 |
| 2 | −1473.54944 | 109.320020 | M2 |
| 3 | 520.49317 | −169.0000000 | M3 |
| 4 | | −351.076040 | AS |
| 5 | 708.60536 | 590.712854 | M4 |

TABLE 2C

ASPHERIC DATA FOR WORKING EXAMPLE 2

| Surface | 1 | 2 | 3 | 5 |
|---|---|---|---|---|
| k | −0.378940 | 22.243233 | −4.178595 | 0.204072 |
| A | −0.660040×10$^{-10}$ | 0.605528×10$^{-9}$ | 0.490911×10$^{-8}$ | −0.271175×10$^{-10}$ |
| B | −0.245853×10$^{-15}$ | 0.514066×10$^{-14}$ | 0.207057×10$^{-14}$ | −0.456580×10$^{-16}$ |
| C | −0.608272×10$^{-21}$ | 0.153342×10$^{-19}$ | 0.112104×10$^{-18}$ | −0.109405×10$^{-21}$ |
| D | 0.167051×10$^{-26}$ | 0.638335×10$^{-24}$ | 0.811872×10$^{-23}$ | −0.705656×10$^{-28}$ |

TABLE 2D

VALUES CORRESPONDING TO CONDITIONS FOR WORKING EXAMPLE 2

| | |
|---|---|
| x/L | 169/520.076040=0.32 |
| (P1 + P4) | −0.00264 |
| (P2 + P3) | 0.002599 |
| (P1 + P4) + (P2 + P3) | −0.000041 |

TABLE 3A

DESIGN VALUES FOR WORKING EXAMPLE 3

| | |
|---|---|
| r1 | −853.5 |
| r2 | −1704.4 |
| r3 | 520.3 |
| r4 | 713.9 |
| K1 | −0.001172 |
| K2 | −0.000587 |
| K3 | 0.00192 |
| K4 | 0.00140 |

TABLE 3B

MORE DESIGN VALUES FOR WORKING EXAMPLE 3

| Surface No. | RDY | THI | |
|---|---|---|---|
| 0 | | 1374.280233 | R |
| 1 | −853.46550 | −128.101268 | M1 |
| 2 | −1704.44202 | 125.101268 | M2 |
| 3 | 520.28809 | −169.0000000 | M3 |
| 4 | | −352.123814 | AS |
| 5 | 713.85066 | 606.097744 | M4 |

TABLE 3C

ASPHERIC DATA FOR WORKING EXAMPLE 3

| Surface | 1 | 2 | 3 | 5 |
|---|---|---|---|---|
| k | −0.255188 | 14.534013 | −4.401675 | 0.181804 |
| A | −0.983673×10$^{-10}$ | −0.178114×10$^{-9}$ | 0.500211×10$^{-8}$ | −0.207371×10$^{-10}$ |
| B | −0.267713×10$^{-15}$ | 0.247201×10$^{-14}$ | 0.156649×10$^{-14}$ | −0.286238×10$^{-16}$ |
| C | −0.178682×10$^{-21}$ | −0.103591×10$^{-19}$ | 0.105717×10$^{-18}$ | −0.102662×10$^{-21}$ |
| D | −0.238078×10$^{-26}$ | 0.668065×10$^{-25}$ | 0.332409×10$^{-23}$ | 0.184894×10$^{-27}$ |

TABLE 3D

VALUES CORRESPONDING TO CONDITIONS FOR WORKING EXAMPLE 3

| | |
|---|---|
| x/L | 169/521.123814=0.32 |
| (P1 + P4) | −0.002572 |
| (P2 + P3) | 0.002507 |
| (P1 + P4) + (P2 + P3) | −0.000065 |

TABLE 4A

DESIGN VALUES FOR WORKING EXAMPLE 4

| |
|---|
| D0 = 869.531130 |
| WD = 465.962530 |
| $\|\beta\|$ = 0.2501 |
| NA = 0.1 |

TABLE 4B

MORE DESIGN VALUES FOR WORKING EXAMPLE 4

| Surface No. | RDY | THI | |
|---|---|---|---|
| 0 | | 869.531130 | First plane RP (object plane) |
| 1 | −991.30343 | −106.493198 | First mirror M1 |
| 2 | | 178.870735 | Second mirror M2 |
| 3 | 352.78285 | −142.505340 | Third mirror M3 |
| 4 | | −266.696202 | Aperture stop AS |
| 5 | 535.95966 | 465.962530 | Fourth mirror M4 |
| 6 | | | Second plane WP (final image plane) |

TABLE 4C

ASPHERIC DATA FOR WORKING EXAMPLE 4

First mirror M1 k = 13.089322
A = 0.127693 × $10^{-8}$
B = 0.205777 × $10^{-13}$
C = −0.198839 × $10^{-18}$
D = 0.622395 × $10^{-23}$

Second mirror M2 k = 0.0
A = −0.803869 × $10^{-9}$
B = 0.141387 × $10^{-13}$
C = −0.900942 × $10^{-18}$
D = 0.224193 × $10^{-22}$

Third mirror M3 k = 1.782655
A = 0.826238 × $10^{-9}$
B = 0.116059 × $10^{-12}$
C = −0.426916 × $10^{-16}$
D = 0.928237 × $10^{-20}$

Fourth mirror M4 k = 0.163145
A = −0.388006 × $10^{-10}$
B = −0.105721 × $10^{-15}$
C = 0.317343 × $10^{-20}$
D = −0.123072 × $10^{-24}$

TABLE 4D

VALUES CORRESPONDING TO CONDITIONS FOR WORKING EXAMPLE 4

| | |
|---|---|
| x | 142.505340 |
| L | 409.201542 |
| X/L | 0.34825221 |
| P1 | −0.002018 |
| P3 | 0.005669 |
| P4 | −0.003732 |
| P1 + P3 + P4 | −0.000080 |

TABLE 5A

DESIGN VALUES FOR WORKING EXAMPLE 5

D0 = 749.589157
WD = 468.911760
|β| = 0.2502
NA = 0.1

TABLE 5B

MORE DESIGN VALUES FOR WORKING EXAMPLE 5

| Surface No. | RDY | THI | |
|---|---|---|---|
| 0 | | 749.589157 | First plane RP (object plane) |
| 1 | −1014.67649 | −100.710099 | First mirror M1 |
| 2 | | 167.308966 | Second mirror M2 |
| 3 | 354.64710 | −148.155383 | Third mirror M3 |
| 4 | | −265.558278 | Aperture stop AS |
| 5 | 533.67214 | 468.911760 | Fourth mirror M4 |
| 6 | | | Second plane WP (final image plane) |

TABLE 5C

ASPHERIC DATA FOR WORKING EXAMPLE 5

First mirror M1 k = 13.341496
A = 0.739963 × $10^{-9}$
B = 0.313480 × $10^{-13}$
C = −0.623481 × $10^{-18}$
D = 0.113100 × $10^{-22}$

Second mirror M2 k = 0.0
A = −0.158741 × $10^{-8}$
B = 0.420408 × $10^{-13}$
C = −0.275394 × $10^{-17}$
D = 0.688212 × $10^{-22}$

Third mirror M3 k = 1.860936
A = 0.107070 × $10^{-8}$
B = 0.127023 × $10^{-12}$
C = −0.445474 × $10^{-16}$
D = 0.965151 × $10^{-20}$

Fourth mirror M4 k = 0.158756
A = −0.437704 × $10^{-10}$
B = −0.124911 × $10^{-15}$
C = 0.216088 × $10^{-20}$
D = −0.798299 × $10^{-25}$

TABLE 5D

VALUES CORRESPONDING TO CONDITIONS FOR WORKING EXAMPLE 5

| | |
|---|---|
| x | 148.155383 |
| L | 413.713661 |
| X/L | 0.35811093 |
| P1 | −0.001917 |
| P3 | 0.005669 |
| P4 | −0.003732 |
| P1 + P3 + P4 | −0.000079 |

When any of the above embodiments is employed in a stepper or other such reduction projection exposure apparatus employing an EUV light source and capable of being used in semiconductor fabrication, multilayer-film mirrors are preferably employed. A multilayer-film mirror is a mirror formed by layering thin films to increase reflectance.

The present invention as described above permits extremely superior imaging performance while keeping the number of reflective surfaces to a comparatively small number, and moreover permits improvement of the imaging performance in the device that is actually manufactured, through use of an aberration correction principle unlike that of conventional Offner-type or quasi-Offner-type correction.

In particular, the present invention makes it possible to arrange an aperture stop at a suitable location without occlusion of effective light rays even while using a small number of reflective surfaces and allows the image side to be made telecentric while keeping the object side generally telecentric. Thus, the present invention makes it possible to maintain the symmetry of the various aberrations in the optical system and satisfactorily correct the aberrations in a well-balanced fashion.

Application of a projection optical system according to the present invention in an exposure apparatus or in photo-lithographic operations for semiconductor fabrication permits the image of a more finely patterned original (reticle or mask) to be transferred to and exposed on a photosensitive substrate in nearly aplanatic fashion. This makes it possible to fabricate satisfactory semiconductor and like devices having higher integration density.

Because the reflective surfaces of mirrors M1–M4 of the present invention are rotationally symmetric higher-order aspheres, higher-order aberrations produced by mirrors M1–M4 are corrected and satisfactory imaging performance is achieved. Nonetheless, any or all of the rotationally symmetric aspheric surfaces may also be made into rotationally asymmetric aspheric surfaces to correct for rotationally asymmetric aberration components present due to errors in surface dimensions of the reflective surfaces of the several mirrors, assembly errors during manufacture of the catoptric reduction projection optical system, and so forth.

Whereas EUV light of wavelength 13.4 nm was used in describing the above embodiments and working examples thereof, the catoptric reduction projection optical systems of the present invention are not limited to use with EUV light. The catoptric reduction projection optical systems associated with the present invention are also capable of being used, for example, in the hard x-ray region below 5 nm or in the vacuum ultraviolet region of 100 nm–200 nm. Here, light emitted from a synchrotron radiation source or the like may, for example, be used as a hard-x-ray-region light source, and an ArF excimer laser (wavelength 193 nm), F2 excimer laser (wavelength 157 nm), or the like may, for example, be used as a vacuum-ultraviolet-region light source.

Thus, the present invention is not to be limited by the specific modes for carrying out the invention described above. In particular, while the present invention has been described in terms of several aspects, embodiments, modes, and so forth, the present invention is not limited thereto. In fact, as will be apparent to one skilled in the art, the present invention can be applied in any number of combinations and variations without departing from the spirit and scope of the invention as set forth in the appended claims, and it is intended to cover all alternatives, modifications and equivalents as may be included within the spirit and scope of the invention as defined in the appended claims.

What is claimed is:

1. A catoptric reduction projection optical system for forming in a second plane a reduced image of an object in a first plane, comprising, in order with respect to a folded optical path on an optical axis, from the first plane to the second plane:
    a) a first mirror having a concavely shaped reflecting surface and a first vertex;
    b) a second mirror having a second vertex;
    c) a third mirror having a convexly shaped reflecting surface and a third vertex;
    d) a single aperture stop;
    e) a fourth mirror having a concavely shaped reflecting surface and a fourth vertex; and
    f) wherein x is a distance along the optical axis from said third vertex to said aperture stop, L is a distance along the optical axis from said third vertex to said fourth vertex, and the following condition is satisfied:

$0.1 \leq x/L \leq 0.9$.

2. A catoptric reduction projection optical system according to claim 1, wherein said second mirror has a convexly shaped reflecting surface.

3. A catoptric reduction projection optical system according to claim 2, wherein the paraxial Petzval value of said first mirror is P1, the paraxial Petzval value of said second mirror is P2, the paraxial Petzval value of said third mirror is P3, the paraxial Petzval value of said fourth mirror is P4, and the following conditions are satisfied:

$-0.005 < (P1+P4) < 0.000$, $0.000 < (P2+P3) < 0.005$, and $-0.005 < (P1+P4)+(P2+P3) < 0.005$.

4. A catoptric reduction projection optical system according to claim 1, wherein:
    a) said second mirror has an aspherically shaped reflecting surface of substantially zero paraxial power; and
    b) the following condition is further satisfied:

$0.1 < x/L < 0.7$.

5. A catoptric reduction projection optical system according to claim 4, wherein the paraxial Petzval value of said first mirror is P1, the paraxial Petzval value of said third mirror is P3, the paraxial Petzval value of said fourth mirror is P4, and the following condition is satisfied:

$-0.005 < (P1+P3+P4) < 0.005$.

6. A catoptric reduction projection optical system according to claim 4, wherein the reflecting surfaces of said first mirror, third mirror, and fourth mirror are respectively aspheric.

7. A catoptric reduction projection optical system according to claim 5, wherein the reflecting surfaces of said first mirror, third mirror, and fourth mirror are respectively aspheric.

8. A catoptric reduction projection optical system according to claim 1, wherein the reflecting surfaces of said first mirror, second mirror, third mirror, and fourth mirror are respectively aspheric.

9. A catoptric reduction projection optical system according to claim 1, wherein said first through fourth mirrors are arranged coaxially along the optical axis.

10. A catoptric reduction projection optical system according to claim 1, wherein said aperture stop has an opening sized so as to admit a full cross section of a light beam incident thereon.

11. A catoptric reduction projection optical system according to claim 1, wherein said aperture stop is arranged so as to cause the catoptric reduction optical system to be second-plane-side telecentric.

12. A catoptric reduction projection optical system according to claim 1, wherein:
    (a) said first and third mirrors are respectively arranged such that the reflecting surfaces thereof face said first plane; and
    (b) said second and fourth mirrors are respectively arranged such that the reflecting surfaces thereof face said second plane.

13. A catoptric reduction projection optical system according to claim 1, wherein said first vertex and said second vertex are axially located between said third vertex and said fourth vertex.

14. A catoptric reduction projection optical system according to claim 1, wherein:

(a) said first and third mirrors are respectively arranged such that the reflecting surfaces thereof face the first plane;

(b) said second and fourth mirrors are respectively arranged such that the reflecting surfaces thereof face the second plane; and (c) said first vertex and said second vertex are axially located between said third vertex and said fourth vertex.

15. A catoptric reduction projection optical system according to claim 1, wherein said aperture stop is arranged and sized so as to cause a light beam bundle cross-section containing all rays effective in image formation to be substantially circular at said second plane.

16. A projection exposure apparatus comprising:

a) a reticle stage capable of holding a reticle in a first plane;

b) a photosensitive substrate stage capable of holding a photosensitive substrate in a second plane;

c) an illumination optical system for guiding actinic light of a prescribed wavelength to the reticle in said first plane; and d) a catoptric reduction projection optical system according to claim 1 arranged between the reticle and the photosensitive substrate.

17. A method of exposing a photosensitive substrate with a pattern present on a reticle, comprising the steps of:

a) illuminating a portion of the pattern present on the reticle;

b) projecting light from the reticle through a catoptric reduction projection optical system according to claim 1; and c) scanning the reticle and the photosensitive substrate relative to said projection optical system and forming an image of substantially the entire pattern on the photosensitive substrate.

* * * * *

UNITED STATES PATENT AND TRADEMARK OFFICE
CERTIFICATE OF CORRECTION

PATENT NO. : 6,109,756
DATED : August 29, 2000
INVENTOR(S) : Tomowaki TAKAHASHI

It is certified that error appears in the above-indentified patent and that said Letters Patent is hereby corrected as shown below:

On the title page item [30], change:

"10-267704" to --10-267707--.

Signed and Sealed this

Twenty-fourth Day of April, 2001

Attest:

NICHOLAS P. GODICI

Attesting Officer  Acting Director of the United States Patent and Trademark Office